(12) United States Patent
Zope et al.

(10) Patent No.: US 9,218,980 B2
(45) Date of Patent: Dec. 22, 2015

(54) SURFACE TREATMENT TO IMPROVE CCTBA BASED CVD CO NUCLEATION ON DIELECTRIC SUBSTRATE

(71) Applicant: Applied Materials, Inc., Santa Clara, CA (US)

(72) Inventors: Bhushan N. Zope, Santa Clara, CA (US); Avgerinos V. Gelatos, Redwood City, CA (US)

(73) Assignee: Applied Materials, Inc., Santa Clara, CA (US)

( * ) Notice: Subject to any disclaimer, the term of this patent is extended or adjusted under 35 U.S.C. 154(b) by 43 days.

(21) Appl. No.: 14/026,147

(22) Filed: Sep. 13, 2013

(65) Prior Publication Data
US 2015/0079784 A1 Mar. 19, 2015

(51) Int. Cl.
| H01L 21/44 | (2006.01) |
| H01L 21/285 | (2006.01) |
| C23C 14/22 | (2006.01) |
| C23C 16/18 | (2006.01) |
| C23C 16/50 | (2006.01) |
| H01L 21/768 | (2006.01) |
| C23C 16/02 | (2006.01) |

(52) U.S. Cl.
CPC .......... *H01L 21/28562* (2013.01); *C23C 14/22* (2013.01); *C23C 16/0245* (2013.01); *C23C 16/0281* (2013.01); *C23C 16/18* (2013.01); *C23C 16/50* (2013.01); *H01L 21/76841* (2013.01)

(58) Field of Classification Search
CPC .................. H01L 21/28518; H01L 21/28556; H01L 21/28562; H01L 21/76843; H01L 29/665
See application file for complete search history.

(56) References Cited

U.S. PATENT DOCUMENTS

| 2006/0157863 A1 | 7/2006 | Marsh |
| 2007/0200243 A1 | 8/2007 | Kraus et al. |
| 2010/0047988 A1 | 2/2010 | Cho et al. |
| 2011/0298062 A1* | 12/2011 | Ganguli et al. ............... 257/410 |
| 2012/0252207 A1 | 10/2012 | Lei et al. |
| 2012/0264291 A1 | 10/2012 | Ganguli et al. |

FOREIGN PATENT DOCUMENTS

KR 2010-0022441 A 3/2010

OTHER PUBLICATIONS

PCT Notification of Transmittal of the International Search Report and the Written Opinion of the International Searching Authority for International Application No. PCT/US2014/050904 dated Nov. 28, 2014; 13 total pages.

* cited by examiner

Primary Examiner — Tony Tran
(74) Attorney, Agent, or Firm — Patterson & Sheridan, LLP

(57) ABSTRACT

Embodiments of the present invention generally relate to a method of forming a cobalt layer on a dielectric material without incubation delay. Prior to depositing the cobalt layer using CVD, the surface of the dielectric material is pretreated at a temperature between 100° C. and 250° C. Since the subsequent CVD cobalt process is also performed at between 100° C. and 250° C., one processing chamber is used for pretreating the dielectric material and forming of the cobalt layer. The combination of processing steps enables use of two processing chambers to deposit cobalt.

5 Claims, 4 Drawing Sheets

SURFACE TREATMENT TO IMPROVE CCTBA BASED CVD CO NUCLEATION ON DIELECTRIC SUBSTRATE

BACKGROUND

1. Field

Embodiments of the invention generally relate to the field of semiconductor manufacturing processes, more particularly, to methods for forming a contact metal layer on dielectric substrate.

2. Description of the Related Art

Semiconductor processing involves a number of different chemical and physical processes whereby minute integrated circuits are created on a substrate. Layers of materials which make up the integrated circuit are created by chemical vapor deposition (CVD), physical vapor deposition (PVD), epitaxial growth, and the like. Some of the layers of material are patterned using photoresist masks and wet or dry etching techniques. The substrate utilized to form integrated circuits may be silicon, gallium arsenide, indium phosphide, glass, or other appropriate material.

As feature sizes have become smaller, the cross section dimensions of logic metal contacts and subsequent metal interconnect layers are decreasing rapidly. CVD cobalt may be used as metal deposition technique for application as metal interconnects. Conventionally, a cobalt thin film is grown on dielectric material such as silicon dioxide or low-k dielectric. Use of organometallic precursors negates the need of a barrier layer, which is used in alternate metal CVD processes utilizing halide based chemistry. However, incubation (growth) of the cobalt layer on the dielectric material is poor and results in non-continuous growth. A titanium nitride (TiN) nucleation layer may be formed on the dielectric material prior to CVD deposition of cobalt layer. However, titanium nitride will not deposit on the dielectric material at less than 300° C. The cobalt layer is deposited at a temperature between 100° C. and 250° C. Thus, two processing chambers may be utilized for the depositions of the nucleation layer and the cobalt layer.

Therefore, an improved method of forming a cobalt layer is needed.

SUMMARY

Embodiments of the present invention generally relate to a method of forming a cobalt layer on a dielectric material without incubation delay. Prior to depositing the cobalt layer using CVD, the surface of the dielectric material is pretreated at a temperature between 100° C. and 250° C. Since the subsequent CVD cobalt process is also performed at between 100° C. and 250° C., only one processing chamber is used for the forming of the cobalt layer.

In one embodiment, a method for forming a metal interconnect is disclosed. The method includes placing a substrate into a processing chamber, pretreating a surface of the substrate at a temperature between 100° C. and 250° C., wherein a monolayer of molecules is formed on the surface of the substrate, and depositing a metal layer on the pretreated surface.

In another embodiment, a transfer chamber connecting a plurality of processing chambers is disclosed. The transfer chamber connecting a plurality of processing chambers has a transfer chamber, at least two cobalt chemical vapor deposition chambers, at least one physical vapor deposition chamber, and at least one plasma enhanced chemical vapor deposition chamber.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present invention generally relate to a method of forming a cobalt layer on a dielectric material without incubation delay. Prior to depositing the cobalt layer using CVD, the surface of the dielectric material is pretreated at a temperature between 100° C. and 250° C. Since the subsequent CVD cobalt process is also performed at between 100° C. and 250° C., only one processing chamber is used for the forming of the cobalt layer.

Figure 1:
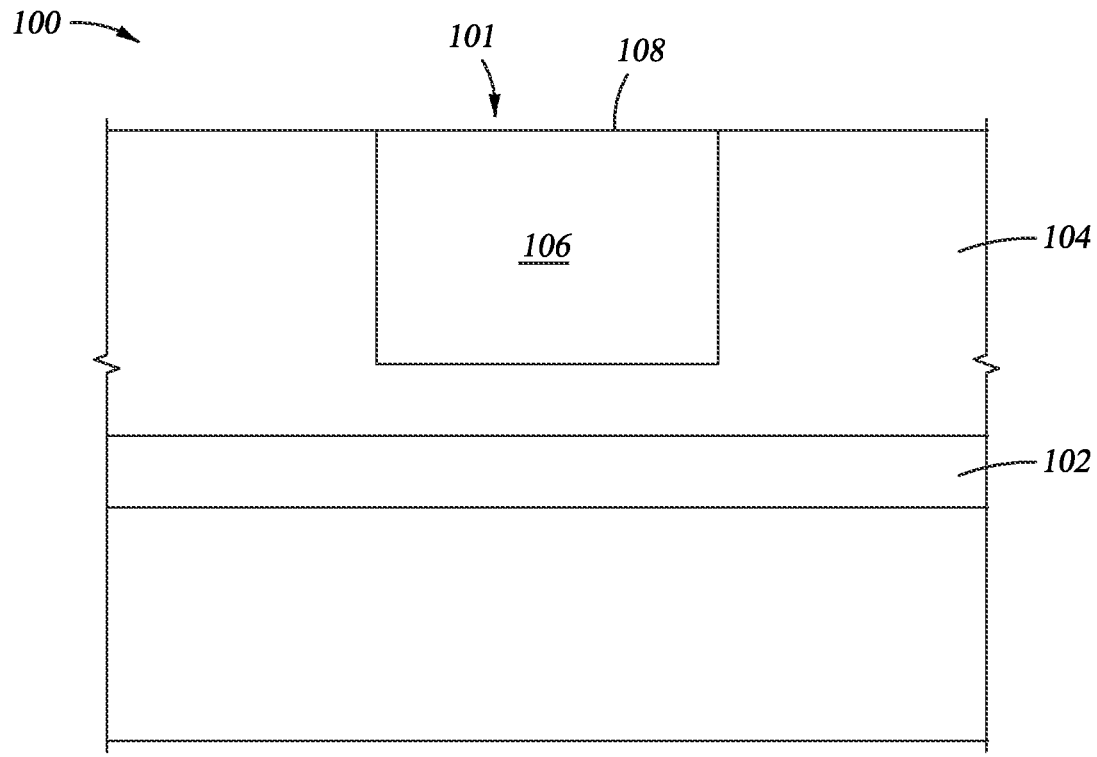
FIG. 1 illustrates a cross sectional view of a substrate having a metal interconnect formed thereon according to one embodiment of the invention.

Referring to FIG. 1, in some embodiments, a device 100 may include a metal interconnect structure 101, which may generally comprise a substrate 102, a dielectric layer 104 and a metal layer 106. In some embodiments, the metal interconnect structure 101 may be disposed within or atop the substrate 102. In such embodiments, the metal interconnect structure 101 may be formed within a feature 108 formed, for example, in the dielectric layer 104 disposed over the substrate 102.

The substrate 102 may be any substrate capable of having material deposited thereon, such as a silicon substrate, for example crystalline silicon (e.g., Si<100> or Si<111>), silicon oxide, strained silicon, doped or undoped polysilicon, or the like, a III-V compound substrate, a silicon germanium (SiGe) substrate, an epi-substrate, a silicon-on-insulator (SOI) substrate, a display substrate such as a liquid crystal display (LCD), a plasma display, an electro luminescence (EL) lamp display, a solar array, solar panel, a light emitting diode (LED) substrate, a semiconductor wafer, or the like.

In some embodiments, the substrate 102 may include a p-type or n-type region defined therein (not shown). The substrate 102 may include other structures or features 108 at least partially formed therein. For example, in some embodiments, the feature 108 (e.g., a via, a trench, a dual damascene feature, high aspect ratio feature, or the like) may be formed within the dielectric layer 104 through any suitable process or processes, such as an etch process.

The dielectric layer 104 may contain silicon dioxide or a low-k dielectric material, such as a silicon carbide oxide material, or a carbon doped silicon oxide material. The dielectric layer 104 may be formed via any process suitable to provide the dielectric layer 104 having a desired thickness. Suitable processes may include CVD, PVD, atomic layer deposition (ALD), and plasma enhanced CVD (PECVD).

The metal layer 106 is a cobalt layer and is deposited using CVD. Organometallic precursors may be used for the CVD process, and one example of the organometallic precursors is dicobalt hexacarbonyl tertbutyl acetylene (CCTBA). The CCTBA based CVD cobalt is deposited at a temperature from about 100° C. to about 250° C. To minimize impurities in the cobalt layer 106, the processing temperature may be in the range of 125° C.-175° C. Conventionally, a nucleation layer such as a TiN layer may be first deposited on the dielectric layer 104 and the cobalt layer 106 is deposited on the TiN layer. TiN does not deposit on the dielectric layer 104 at a temperature that is less than 300° C. The processing temperature of TiN deposition is much higher than the processing temperature of cobalt deposition, thus two processing chambers are used for any process using cobalt as a metal interconnect material, causing loss of productivity by decreasing system throughput. Depositing the cobalt layer 106 without the TiN nucleation layer may cause incubation delay. Incubation delay, or growth delay, means the growth rate of the cobalt layer 106 is very slow at the beginning of the deposition process. To eliminate any incubation delay, the surface of the dielectric layer 104 is pre-treated before the cobalt layer 106 is deposited on the dielectric layer 104.

Figure 2:
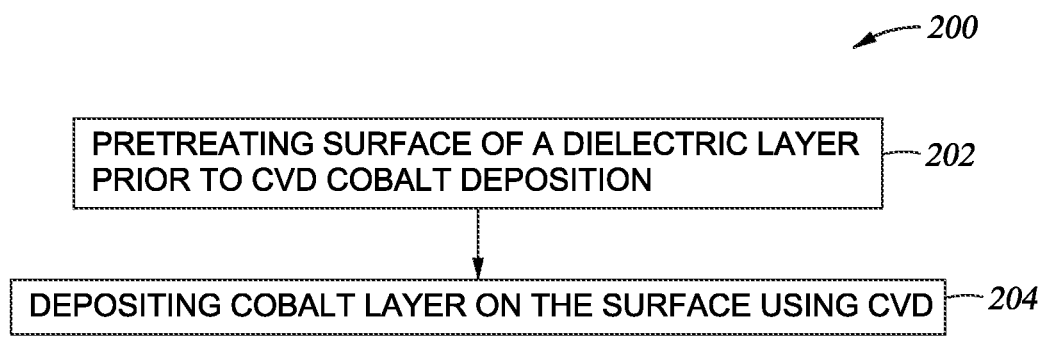
FIG. 2 illustrates a method for depositing a cobalt layer according to one embodiment of the invention.

FIG. 2 illustrates a method 200 for depositing a cobalt layer without any incubation delay according to one embodiment of the invention. At step 202, the surface of the dielectric layer 104 is pretreated prior to the deposition of the cobalt layer 106 into the feature 108. In one embodiment, the pretreatment includes exposing the dielectric layer 104 to a precursor gas containing titanium at process temperature used during CVD cobalt deposition. The precursor gas may be tetrakis(dimethylamino)titanium (TDMAT), titanium tetrachloride (TiCl$_4$) or the like. The surface of the dielectric layer 104 is exposed to the precursor gas at the same temperature as the CVD cobalt deposition temperature, such as from about 100° C. to about 250° C. In one embodiment, the pretreatment and the CVD cobalt deposition have the same process temperature, ranging from about 125° C. to about 175° C. At these temperature ranges, no TiN layer is deposited; instead a monolayer of the precursor molecules is deposited on the surface of the dielectric layer 104, including the surface of dielectric layer 104 inside the feature 108.

In another embodiment, the surface of the dielectric layer 104 is pretreated with an ammonia or nitrogen based plasma. The plasma pretreatment is also performed at process temperature used during CVD cobalt deposition. A monolayer of nitrogen molecules is formed on the dielectric layer 104. In another embodiment, both TDMAT exposure and ammonia or nitrogen plasma treatment are utilized. The TDMAT exposure may be performed before the ammonia or nitrogen plasma treatment, or performed after the ammonia or nitrogen plasma treatment.

Next, at step 204, the cobalt layer 106 is deposited on the dielectric layer 104, including on the dielectric layer 104 inside the feature 108. The cobalt layer 106 is deposited using a CVD process and the CVD process is performed in the chamber in which the pretreatment process is performed. The precursor used in the CVD process may be CCTBA and the cobalt layer 106 may have a thickness of less than 10 nanometers. Pretreating the dielectric surface 104 eliminated any incubation delay during CVD cobalt deposition. In addition, the cobalt layer 106 deposited on the pretreated dielectric surface has lower resistivity compared to cobalt layers formed on untreated dielectric surface.

Figure 3:
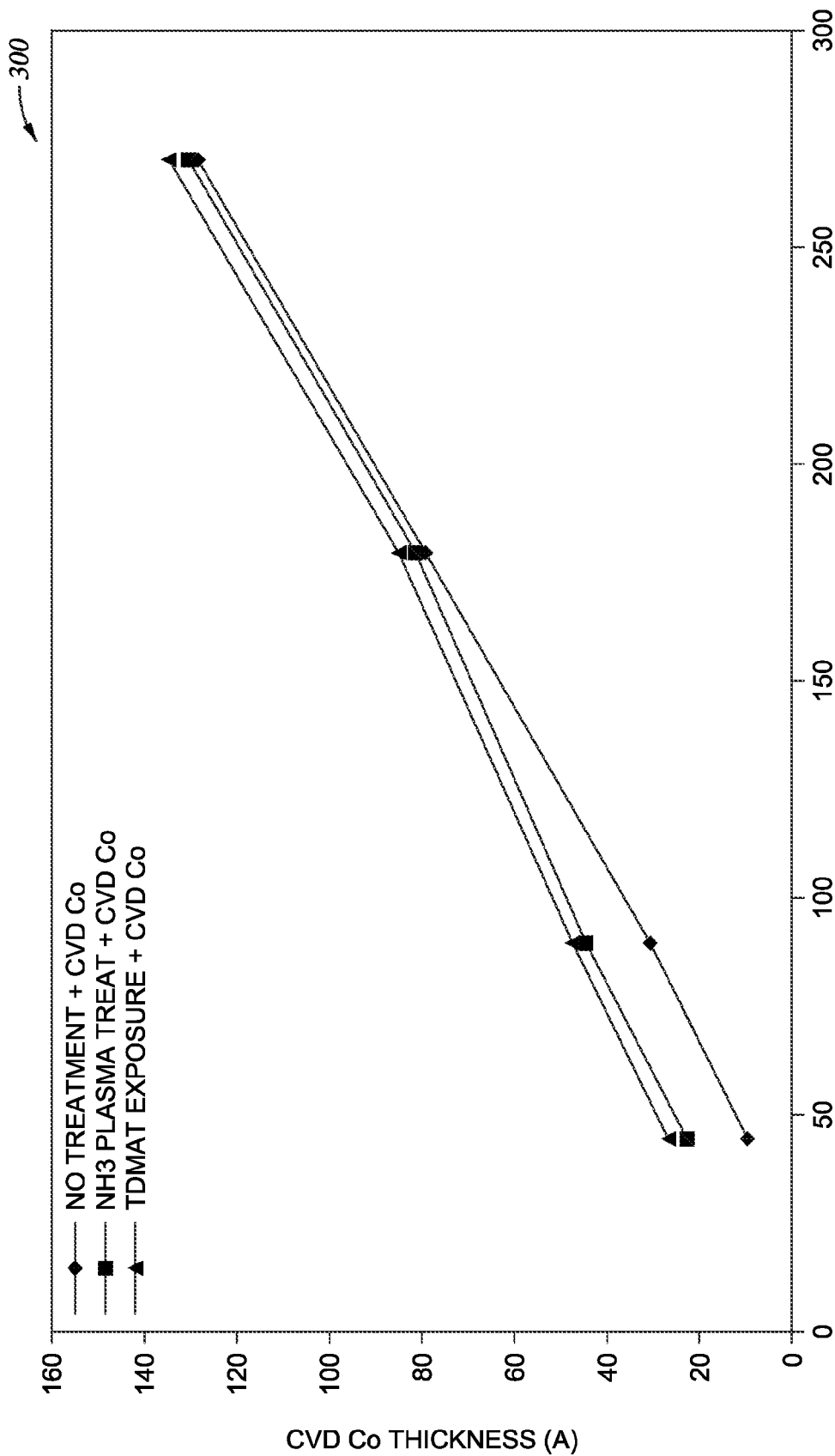
FIG. 3 is a chart showing a relationship between CVD cobalt thickness and deposition time.

FIG. 3 is a chart 300 showing a relationship between CVD cobalt layer thickness and deposition time for no pretreatment, ammonia plasma treatment and TDMAT exposure treatment. As shown in chart 300, both ammonia plasma and TDMAT exposure treatments result in a thicker cobalt layer at early stage of the deposition process.

Figure 4:
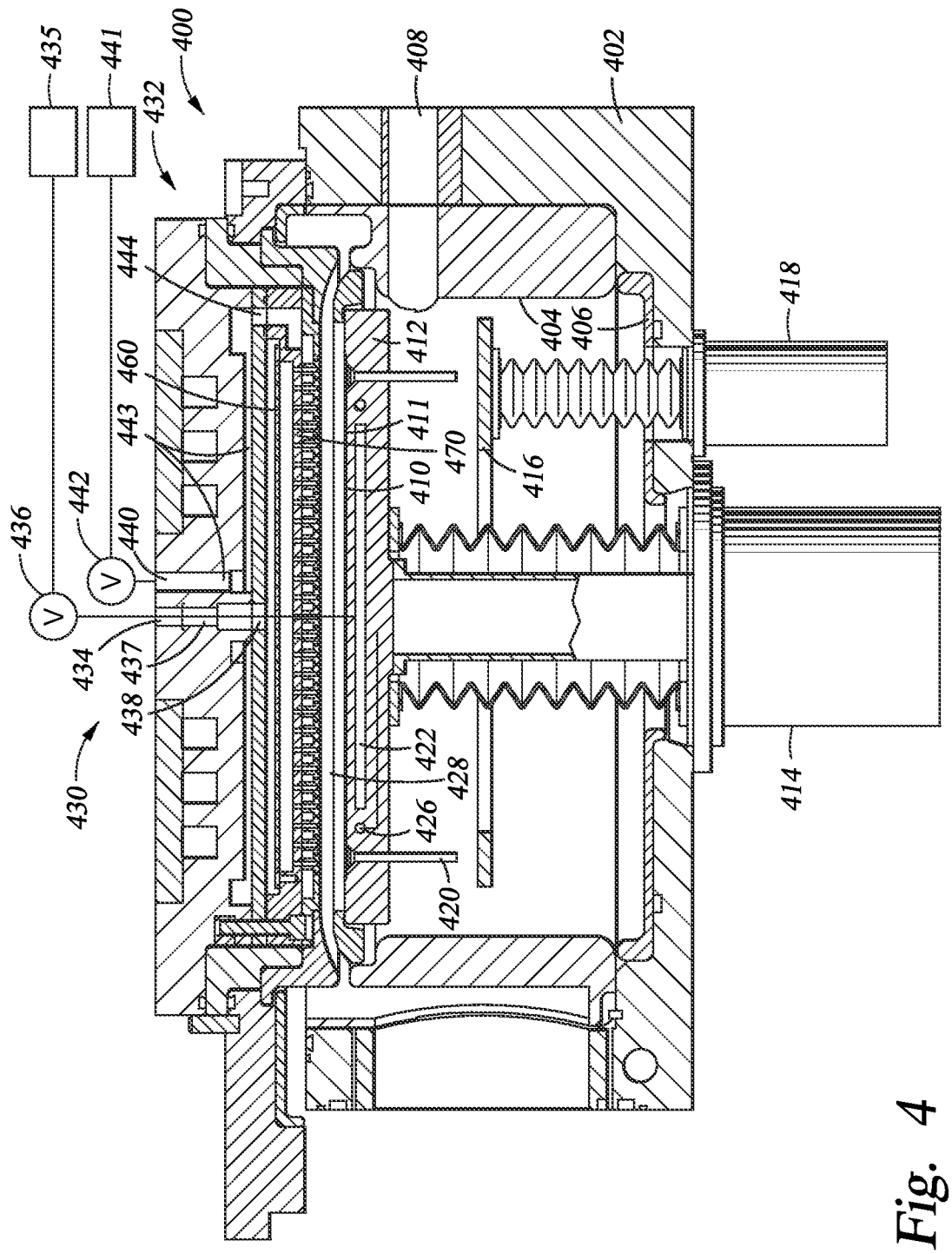
FIG. 4 is a schematic cross sectional view of a processing chamber which may be adapted to perform the processes disclosed herein.

FIG. 4 is a schematic cross sectional view of a processing chamber 400 which may be adapted to perform the processes disclosed herein. The processing chamber 400 may be a CVD chamber that is adapted to perform the pretreatment step 202 and the CVD cobalt deposition step 204, as described in FIG. 2. The chamber 400 comprises a chamber body 402 having sidewalls 404 and a bottom 406. A liner, such as a quartz liner, may line the sidewalls 404 and the bottom 406 of the chamber body 402 to provide thermal and/or electrical insulation. An opening 408 in the chamber 400 provides access for a robot (not shown) to deliver and retrieve substrates 410 to the chamber 100.

A substrate support 412 supports the substrate 410 in the chamber 400 on a substrate receiving surface 411. The substrate support 412 is mounted to a lift motor 414 to raise and lower the substrate support 412 and a substrate 410 disposed thereon. A lift plate 416 connected to a lift motor 418 is mounted in the chamber and raises and lowers pins 420 movably disposed through the substrate support 412. The pins 420 raise and lower the substrate 410 over the surface of the substrate support 412.

The substrate support 412 may be heated to heat the substrate 410 disposed thereon. For example, the substrate support 412 may have an embedded heating element 422 to resistively heat the substrate support 412 by applying an electric current from a power supply (not shown). A temperature sensor 426, such as a thermocouple, may be embedded in the substrate support 412 to monitor the temperature of the substrate support 412. For example, a measured temperature may be used in a feedback loop to control electric current applied to the heating element 422 from a power supply (not shown), such that the substrate temperature can be maintained or controlled at a desired temperature or within a desired temperature range. Alternatively, the substrate 410 may be heated using radiant heat, such as by lamps.

A gas distribution system 430 is disposed at an upper portion of the chamber body 402 to provide two gas flows distributed in a substantially uniform manner over a substrate 410 disposed on the substrate receiving surface 411 in which the two gas flows are delivered in separate discrete paths through the gas distribution system 430. One gas flow path may be used for the pretreatment step 202 while the other may be used for the CVD cobalt deposition step 204. In the embodiment shown, the gas distribution system 430 comprises a gas box 432, a blocker plate 460 positioned below the gas box 432, and a showerhead 470 positioned below the blocker plate 460. The gas distribution system 430 provides two gas flows through two discrete paths to a processing region 428 defined between the showerhead 470 and the substrate support 412.

The gas box 432 as used herein is defined as a gas manifold coupling gas sources to the chamber. The gas box 432 comprises a first gas channel 437 and a second gas channel 443 providing two separate paths for the flow of gases through the gas box 432. The first gas channel 437 comprises a first gas input 434 and a first gas outlet 438. The first gas input is adapted to receive a first gas from a first gas source 435 through valve 436. The first gas outlet 438 is adapted to deliver the first gas to the top of the blocker plate 460. The second gas channel 443 of the gas box 432 comprises a second gas input 440 and a second gas outlet 444. The second gas input 440 is adapted to receive a second gas from a second gas source 441 through valve 442. The second gas outlet 444 is adapted to deliver the second gas to top of the showerhead 470. The term "gas" as used herein is intended to mean a single gas or a gas mixture. The valves 436, 442 control delivery of the first gas and the second gas into the first gas input 434 and the second gas input 440 respectively. Gas sources 435, 441 may be adapted to store a gas or liquid precursor in a cooled, heated, or maintained at ambient environment. The gas lines fluidly coupling the gas sources 435, 441 to the gas inputs 434, 440 may also be heated, cooled, or at ambient temperature.

Figure 5:
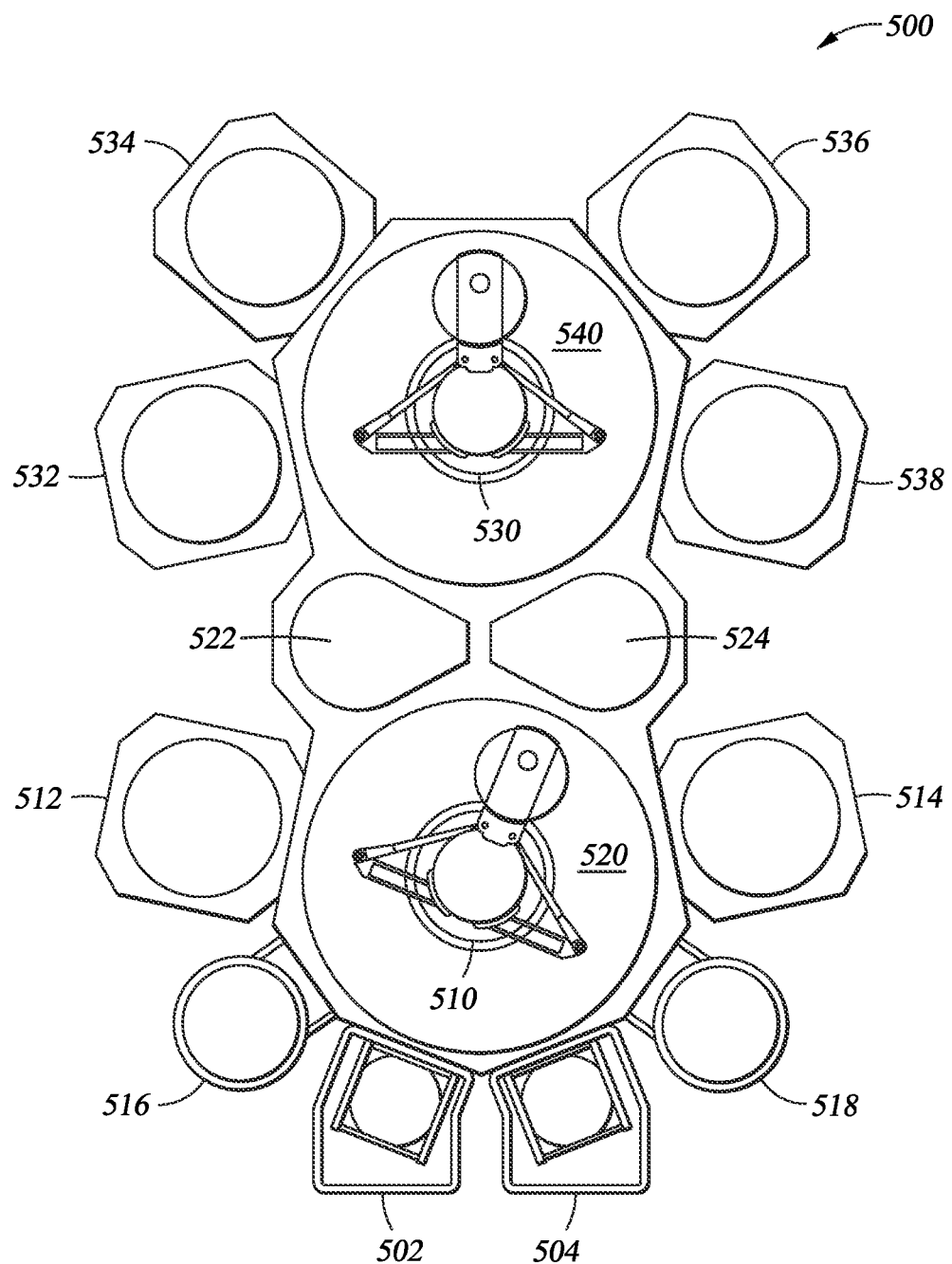
FIG. 5 is a schematic top view of a multi-chamber processing system which may be adapted to perform the processes disclosed herein.

FIG. 5 is a schematic top view of a multi-chamber processing system 500 which may be adapted to perform the processes disclosed herein. Examples of suitable multi-chamber processing systems include the ENDURA® and PRODUCER® processing systems, commercially available from Applied Materials, Inc. of Santa Clara, Calif. The system 500 generally includes load lock chambers 502, 504, for the transfer of substrates (such as substrates 102 described above) into and out from the system 500. Since the system 500 is operated under vacuum, the load lock chambers 502, 504 may be "pumped down" to maintain to facilitate entry and egress of substrates to the system. A first robot 510 disposed in a first transfer chamber 520 may transfer the substrate between the load lock chambers 502, 504, processing chambers 512, 514, passthrough chambers 522, 524, and other processing chambers 516, 518. Each processing chamber 512, 514, 516, 518 may be outfitted to perform a number of substrate processing operations such as ALD, CVD, PVD, etch, preclean, degas, orientation and other substrate processes. The passingthrough chambers 522, 524 typically are used for cool down of the substrates.

The passthrough chambers 522, 524 are connected to a second transfer chamber 540. The second transfer chamber 540 is connected to a plurality of processing chambers. In one embodiment, processing chambers 532, 534, 536 and 538 are connected to the second transfer chamber 540. An optional anneal chamber (not shown) may be connected to the second transfer chamber 540. A second robot 530 disposed in the second transfer chamber 540 may transfer the substrate between processing chambers 532, 534, 536, 538 and the passthrough chambers 522, 524.

In one embodiment, the processing chambers 532, 534, 536, 538 include essentially at least two CVD cobalt deposition chambers, at least one PVD chamber, and at least one plasma enhanced CVD chamber. The at least two CVD cobalt deposition chambers may be the processing chamber 400 described above. In one embodiment, processing chambers 534, 536 are the processing chambers that are adapted to perform both the pretreatment process and the CVD cobalt deposition, such as the processing chamber 400. The processing chamber 532 is a PVD chamber used for PVD cobalt deposition. The processing chamber 538 is a plasma processing chamber such as a plasma enhanced CVD chamber used for contact applications. Conventional method of forming a TiN nucleation layer prior to CVD cobalt deposition would utilize an additional processing chamber, leaving only one CVD cobalt deposition chamber connected to the transfer chamber 530. Since CVD cobalt deposition is relatively slow, having two pretreatment/CVD cobalt deposition processing chambers helps increasing throughput.

In summary, a single processing chamber is utilized to perform both pretreatment of the dielectric layer and CVD cobalt deposition. The pretreatment of the dielectric layer includes exposing the dielectric layer to a TDMAT precursor gas or to an ammonia or nitrogen plasma. The processing temperature for the pretreatment and the CVD cobalt deposition may be the same. Pretreating the dielectric layer prior to CVD cobalt deposition eliminates incubation delay. In addition, throughput is increased since two CVD cobalt deposition chambers may be included in a processing system.

While the foregoing is directed to embodiments of the present invention, other and further embodiments of the invention may be devised without departing from the basic scope thereof, and the scope thereof is determined by the claims that follow.

The invention claimed is:

1. A method for forming a metal interconnect, comprising:
    placing a substrate into a processing chamber;
    pretreating a surface of the substrate at a temperature between 125° C. and 175° C., wherein the pretreating the surface of the substrate comprises exposing the surface to a titanium containing precursor gas to form a monolayer of the titanium containing precursor gas molecules on the surface; and
    depositing a cobalt layer in direct contact with the surface, wherein the cobalt layer is deposited using dicobalt hexacarbonyl tertbutyl acetylene and no titanium nitride is formed between the cobalt layer and the surface.

2. The method of claim 1, wherein the cobalt layer is deposited by a chemical vapor deposition process.

3. The method of claim 2, wherein the chemical vapor deposition is performed at a temperature between 100° C. and 250° C.

4. The method of claim 3, wherein the surface of the substrate comprises silicon dioxide or a low-k dielectric.

5. The method of claim 1, wherein the titanium containing precursor gas comprises tetrakis(dimethylamino)titanium or titanium tetrachloride.

* * * * *